(12) United States Patent  
Kudo et al.

(10) Patent No.: US 6,682,629 B2
(45) Date of Patent: Jan. 27, 2004

(54) SUBSTRATE PROCESSING UNIT

(75) Inventors: Hiroyuki Kudo, Kumamoto (JP); Takahiro Okubo, Kumamoto (JP); Minoru Kubota, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 98 days.

(21) Appl. No.: 10/001,341

(22) Filed: Oct. 24, 2001

(65) Prior Publication Data

US 2002/0079056 A1 Jun. 27, 2002

(30) Foreign Application Priority Data

Oct. 26, 2000 (JP) ........................................ 2000-326888

(51) Int. Cl.[7] ........................ C23F 1/00; H01L 21/306; C23C 16/00
(52) U.S. Cl. .............................. 156/345.32; 156/345.3; 156/345.19; 118/719; 414/935
(58) Field of Search .................................. 118/719, 715; 156/345.3, 345.31, 345.32, 345.19; 414/939, 935.7, 180; 204/298.11

(56) References Cited

U.S. PATENT DOCUMENTS

| | | | | |
|---|---|---|---|---|
| 4,209,357 A | * | 6/1980 | Gorin et al. ................ 438/710 |
| 4,503,807 A | * | 3/1985 | Nakayama et al. ......... 118/719 |
| 4,624,738 A | * | 11/1986 | Westfall et al. ............. 438/716 |
| 4,718,975 A | * | 1/1988 | Bowling et al. ......... 204/298.11 |
| 4,816,638 A | * | 3/1989 | Ukai et al. .............. 219/121.43 |
| 4,869,801 A | * | 9/1989 | Helms et al. .......... 204/298.15 |
| 5,044,311 A | * | 9/1991 | Mase et al. .............. 118/723 E |
| 5,236,509 A | * | 8/1993 | Sioshansi et al. ........... 118/719 |
| 5,620,560 A | | 4/1997 | Akimoto et al. |
| 5,997,588 A | * | 12/1999 | Goodwin et al. .......... 29/25.01 |
| 5,998,766 A | | 12/1999 | Mizosaki et al. |
| 6,089,763 A | * | 7/2000 | Choi et al. .................. 396/611 |
| 6,488,824 B1 | * | 12/2002 | Hollars et al. ......... 204/192.22 |

* cited by examiner

*Primary Examiner*—Parviz Hassanzadeh
*Assistant Examiner*—Karla Moore
(74) *Attorney, Agent, or Firm*—Rader, Fishman & Grauer PLLC

(57) ABSTRACT

The present invention is a processing unit for processing a substrate in a casing, having: a transfer port provided in the casing through which the substrate passes when the substrate is carried into the casing by a carrier for carrying the substrate; and an inflow restricting device for controlling an atmosphere outside the casing to restrict the atmosphere from flowing into the casing through the transfer port. According to the present invention, it is possible to control the atmosphere outside the casing to restrict the atmosphere from flowing into the casing, which restricts the temperature of the substrate in the processing unit from partially varying and the temperature distribution from becoming ununiform within a plane of the substrate.

12 Claims, 12 Drawing Sheets

SUBSTRATE PROCESSING UNIT

BACKGROUND OF THE INVENTION

1. Field of the Invention

The present invention relates to a substrate processing unit.

2. Description of the Related Art

In a photolithography process, for example, in semiconductor device fabrication processes, resist coating treatment for forming a resist film on a surface of a wafer, exposure processing for performing exposure by irradiating the wafer in a pattern, developing treatment for developing the wafer after the exposure, heat treatment and cooling treatment before the coating treatment, before and after the exposure processing and after the developing treatment, and so on are performed, and these treatments are performed in various kinds of processing units of a coating and developing treatment system.

For example, cooling treatment before the coating treatment is performed in a manner that the wafer is mounted on a cooling plate provided in a casing for a predetermined period to be cooled to a predetermined temperature, for example, 23° C. A cooling unit in which such a cooling treatment is performed is provided with an exhaust means for removing impurities, which are produced from the wafer or the like, by sucking an atmosphere in the casing, and therefore the pressure in the casing is lower than that outside the casing. Further the casing is provided with a transfer port through which the wafer is carried in/out, and the transfer port is provided with a shutter for opening and closing the transfer port to keep a predetermined atmosphere within the cooling unit.

In the coating and developing treatment system, air for keeping a clean atmosphere therein is supplied to form a descending current. As the air in this event, the atmosphere in a clean room in which the coating and developing treatment system is located is used, and the temperature of the air when supplied is the same as that in the clean room, for example, 23° C. In the coating and developing treatment system, however, a number of heat treatment units where heat treatment is performed are provided, and thus the temperature of the air varies in the coating and developing treatment system by heat from these heat treatment units.

Further, a carrier for carrying the wafer between the various kinds of processing units including the cooling unit is provided in the coating and developing treatment system, and when the carrier carries the wafer into/out of the cooling unit, the aforesaid shutter of the casing is opened to pass the wafer through the transfer port.

As described above, however, since downflow is formed in the coating and developing treatment system and a negative pressure is formed in the cooling unit, the air in the coating and developing treatment system flows into the cooling unit when the shutter of the cooling unit is opened. Further, the temperature of the air flowing in is different from that of the wafer, and thus when the wafer for which cooling treatment has been finished is carried out, the temperature of only a part of the wafer close to the transfer port varies due to the air flowing in.

As a result, unevenness occurs in temperature distribution within a plane of the wafer. The wafer in this state is carried to the resist coating unit and coated with a resist solution thereon, which leads to the fact that the resist solution is applied onto the wafer having uneven temperatures, causing unevenness in thickness of the resist film. Consequently, resist films having a predetermined thickness cannot be obtained, resulting in decreased yields.

SUMMARY OF THE INVENTION

The present invention is made in consideration of the above-described aspects, and its object is to provide a substrate processing unit which restricts flow of gas into a processing unit such as a cooling unit or the like, the flow of which causes unevenness in temperature within a plane of a wafer or the like.

In order to achieve the above object, the substrate processing unit of the present invention is a processing unit for processing a substrate in a casing, having: a transfer port provided in the casing, through which the substrate passes when the substrate is carried into the casing by a carrier for carrying the substrate; and an inflow restricting device for controlling an atmosphere outside the casing to restrict the atmosphere from flowing into the casing through the transfer port.

According to the invention, since the inflow restricting device is provided, it is possible to control a flow of the atmosphere outside the casing to restrict the atmosphere from flowing into the casing. This restricts the temperature of the substrate in the processing unit from partially varying by the atmosphere and temperature distribution from becoming ununiform within a plane of the substrate.

The inflow restricting device may have a guide plate for guiding in a direction away from the transfer port a gas current of the atmosphere flowing from top to bottom.

Further, the inflow restricting device may further have a current regulating plate for regulating in a direction away from the transfer port a gas current of the atmosphere flowing from bottom to top.

Furthermore, the carrier may be structured to have a guide for guiding in a direction, other than the direction of the transfer port, the atmosphere guided by the guide plate. The guide is provided on the carrier side as in the above manner leads to better results.

DETAILED DESCRIPTION OF THE INVENTION

Figure 1:
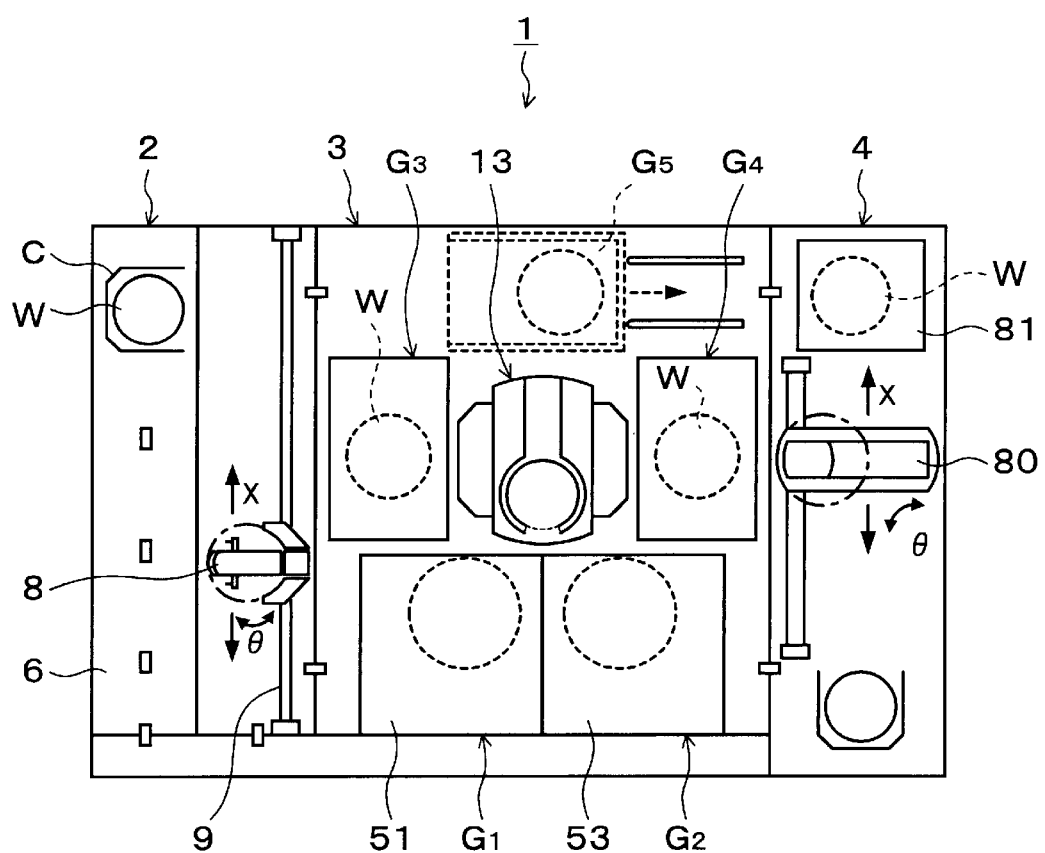
FIG. 1 is a plan view showing a schematic structure of a coating and developing treatment system including a cooling unit according to an embodiment.
Figure 2:
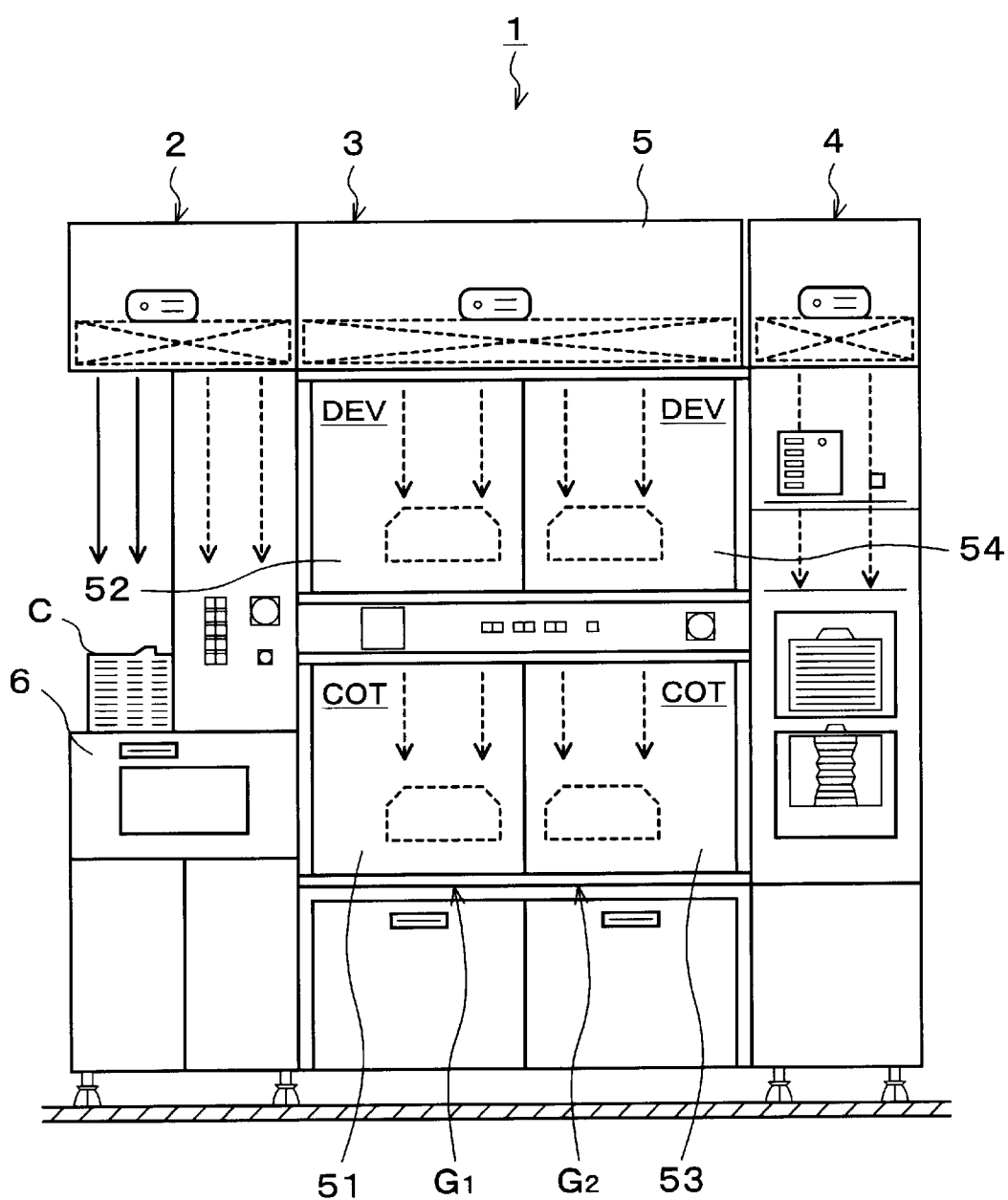
FIG. 2 is a front view of the coating and developing treatment system in FIG. 1.
Figure 3:
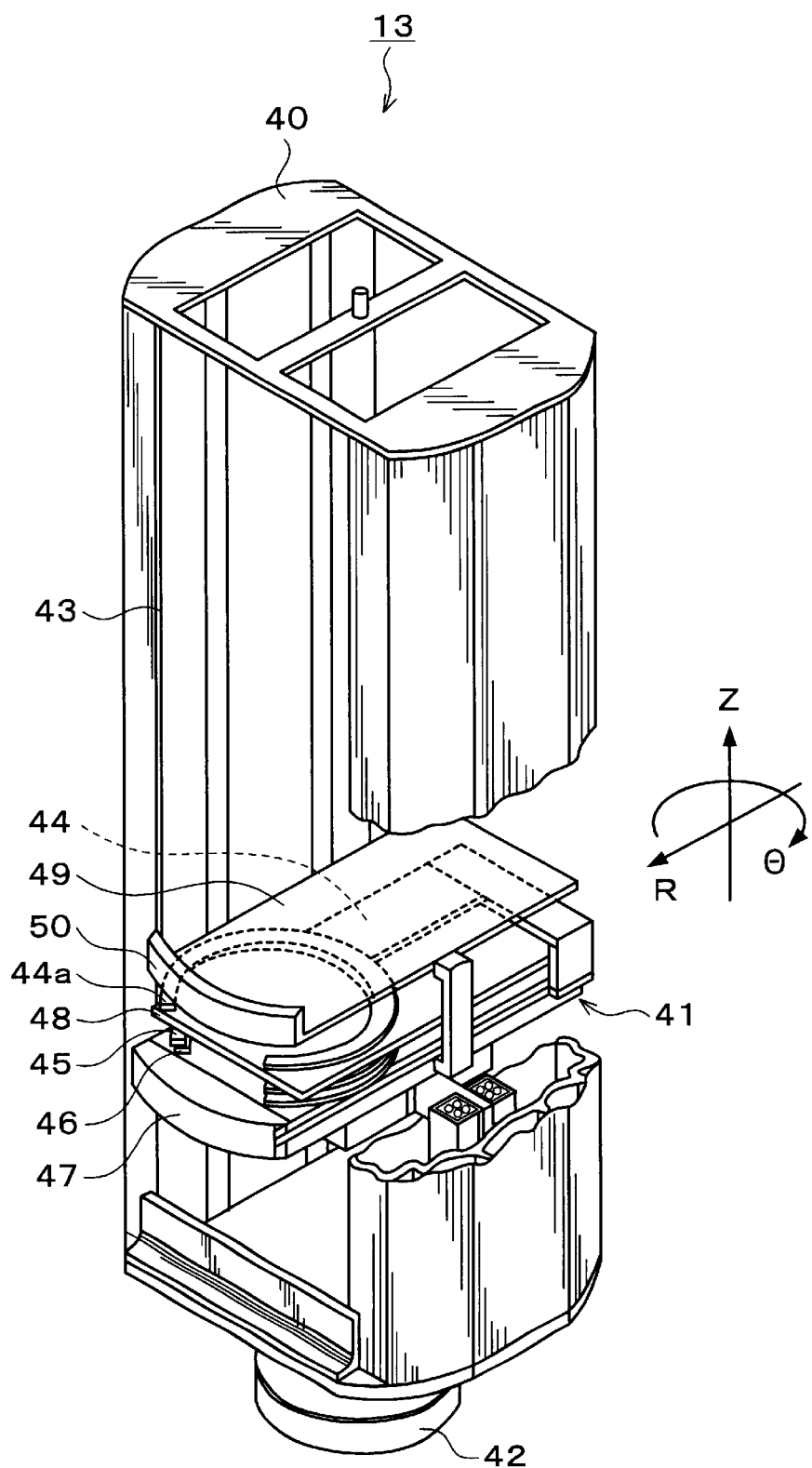
FIG. 3 is a schematic perspective view of a main carrier.

Hereinafter, a preferred embodiment of the present invention will be described. FIG. 1 is a plan view of a coating and developing treatment system 1 including a substrate processing unit according to the invention, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for carrying, for example, 25 wafers W in a unit of cassette from/to the outside to/from the coating and developing treatment system 1 and for carrying the wafers W to/from a cassette C, a processing station 3 composed of various kinds of processing units which are disposed in multi-tiers, for performing predetermined processing for the wafers W one by one in coating and developing processes, and an interface section 4 for delivering the wafers W to/from a not-shown aligner which is disposed adjacent to the processing station 3 are integrally connected. Further, at the top of the coating and developing treatment system 1, an air supply unit 5 is provided as shown in FIG. 2 for supplying air, which has been cleaned and adjusted to predetermined temperature and humidity, into the coating and developing treatment system 1 to form a descending current by the air in the coating and developing treatment system 1 so as to purge the inside of the coating and developing treatment system 1.

In the cassette station 2, as shown in FIG. 1, a plurality of the cassettes C are mountable in predetermined positions on a cassette mounting table 6, which serves as a mounting portion, in a line in an X-direction (a vertical direction in FIG. 1). Furthermore, a wafer carrier 8, which is movable in the alignment direction of the cassettes (the X-direction) and in an alignment direction of the wafers W housed in the cassette C (a Z-direction; a perpendicular direction), is provided to be movable along a carrier path 9 so that it is selectively accessible to each of the cassettes C.

The wafer carrier 8 has an alignment function for aligning the wafers W. The wafer carrier 8 is structured so as to be also accessible to an extension unit 57 included in a third processing unit group G3 on a processing station 3 side as will be described below.

In the processing station 3, a main carrier 13 is provided in a center part thereof, and various kinds of the processing units are multi-tiered on a periphery of the main carrier 13 to constitute processing unit groups. In the coating and developing treatment system 1, where four processing unit groups G1, G2, G3 and G4 are provided, the first and the second processing unit groups G1 and G2 are disposed on a front side of the coating and developing treatment system 1, the third processing unit group G3 is disposed adjacent to the cassette station 2, and the fourth processing unit group G4 is disposed adjacent to the interface section 4. Furthermore, a fifth processing unit group G5 depicted by the broken line is allowed to be additionally disposed on a rear side as an option. The main carrier 13 is capable of carrying the wafers W to/from various kinds of later described processing units which are disposed in these processing unit groups G1, G2, G3, and G4. Incidentally, the number and the arrangement of the processing unit groups vary depending on which kind of processing is performed on the wafers W, and the number of the processing unit groups is arbitrary.

The structure of the main carrier 13 is explained in detail here. The main carrier 13 has, as shown in FIG. 3, a cylindrical case 40 and a wafer transfer mechanism 41, as a carrier for holding and carrying the wafer W, in the case 40.

Under the case 40, a rotary mechanism 42 provided with a motor and the like is provided, so that the wafer transfer mechanism 41 is rotatable in a desired direction by rotating the whole case 40 in a θ-direction (a direction of rotation about a Z-axis). The case 40 is also provided with a rectangular opening 43 through which the wafer W is carried into/out of the case 40.

Figure 4:
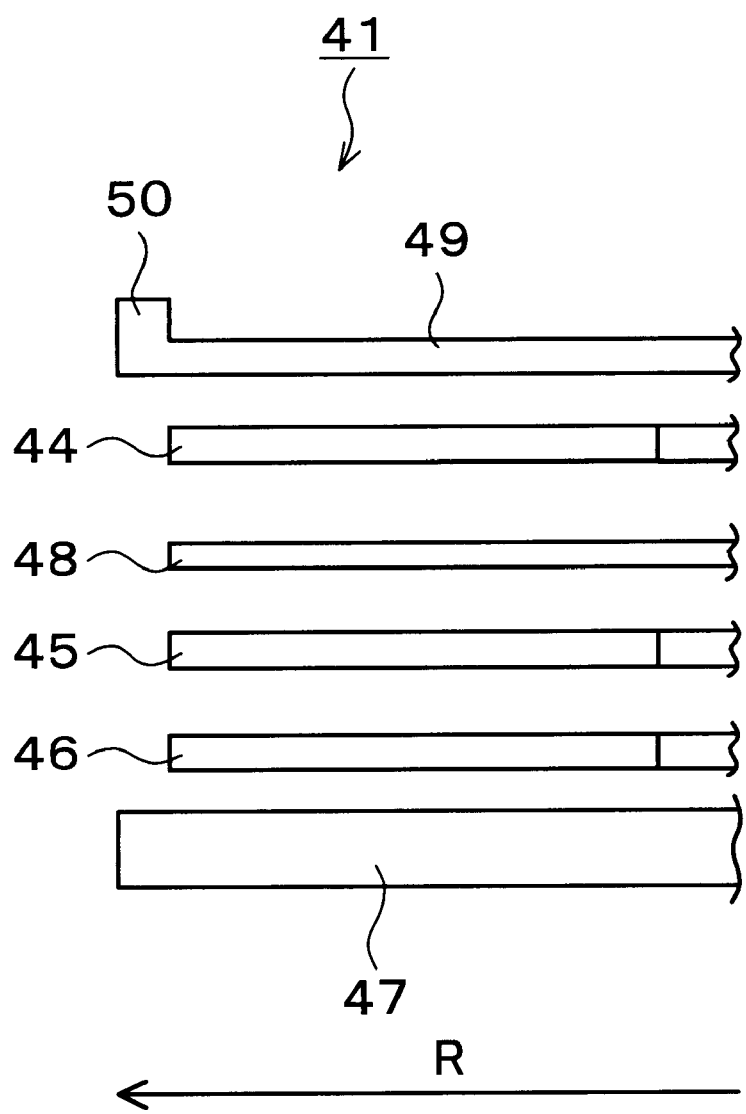
FIG. 4 is an explanatory view of a wafer transfer mechanism in FIG. 3 when it is viewed from a side view.

The wafer transfer mechanism 41 as a carrier has, as shown in FIG. 3 and FIG. 4, three carrier arms 44, 45 and 46 which directly hold the wafer W and a transfer base 47 for supporting the carrier arms 44, 45 and 46. The carrier arms 44, 45 and 46 are arranged on the transfer base 47 in tiers in the order from the top.

The carrier arm 44 has at the tip, as shown in FIG. 3, a C-shaped supporting portion 44a, in an almost three-fourths ring shape, to support the wafer W on the supporting portion 44a. The carrier arm 44 is configured to be movable forward and backward (in an R-direction in FIG. 3) separately with respect to the transfer base 47, so that it can individually move to the various kinds of processing units described below. The transfer base 47 itself is also movable in the Z-direction (the perpendicular direction) along the case 40 so that the carrier arm 44 is also movable in the vertical direction with the movement. Incidentally, the carrier arms 45 and 46 are configured similarly to the carrier arm 44 and thus the description thereof is omitted.

Between the uppermost carrier arm 44 and the carrier arm 45, a shielding plate 48 in a flat plate shape is provided fixed to the transfer base 47 to suppress heat interference between the wafers W held on the carrier arm 44 and the carrier arms 45 and 46.

Above the carrier arm 44, a horizontal plate 49 covering the upper surface of the carrier arm 44 is provided supported by the transfer base 47. Further, a vertical plate 50 in a curved shape which is convex toward a positive direction of the R-direction as viewed from a plan view, is provided on the horizontal plate 49 on the positive direction side of the R-direction. With the above-described configuration, air from above can be diffused by the horizontal plate 49, and when the diffused air flows out in the positive direction of the R-direction, the air can be blocked by the vertical plate 50 to be restricted from flowing in the positive direction of the R-direction. In other words, the air from above can be restricted from flowing in directions of the various kinds of processing units described below to which the wafer W is to be carried.

In the first processing unit group G1, for example, as shown in FIG. 2, a resist coating unit 51 for applying a resist solution onto the wafer W to form a resist film and a developing unit 52 for developing the wafer W after exposure processing are two-tiered in the order from the bottom. Similarly, in the second processing unit group G2, a resist coating unit 53 and a developing unit 54 are two-tiered in the order from the bottom.

Figure 5:
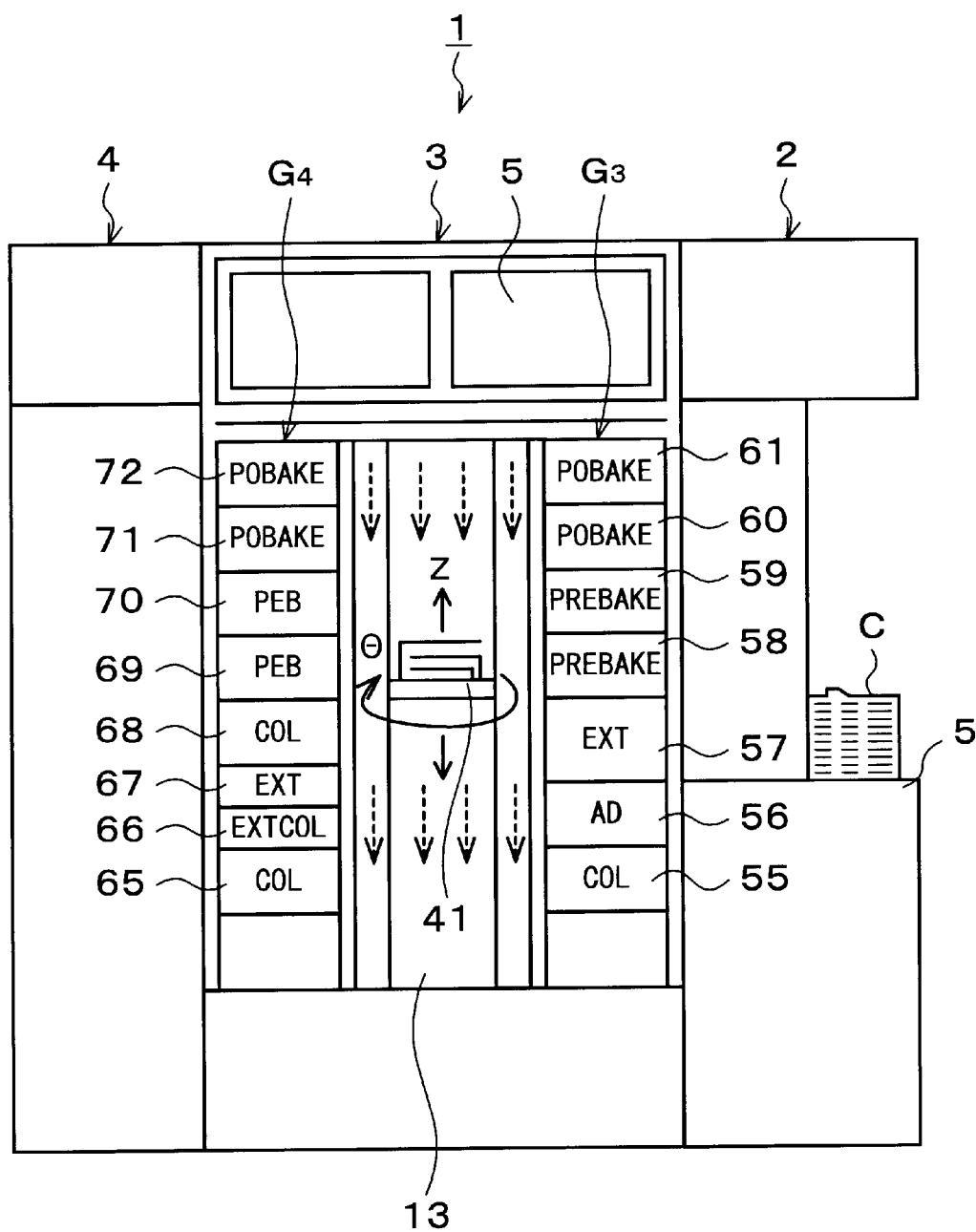
FIG. 5 is a rear view of the coating and developing treatment system in FIG. 1.

In the third processing unit group G3, for example, as shown in FIG. 5, a cooling unit 55 as the above-described substrate processing unit according to this embodiment, an adhesion unit 56 for increasing fixability between a resist solution and the wafer W, the extension unit 57 for keeping the wafer W on stand-by therein, pre-baking units 58 and 59 for drying a solvent in the resist solution, post-baking units 60 and 61 for performing heat treatment after the developing treatment, and so on are, for example, seven-tiered in the order from the bottom.

In the fourth processing unit group G4, for example, a cooling unit 65, an extension and cooling unit 66 for spontaneously cooling the mounted wafer W, an extension unit 67 a cooling unit 68, post-exposure baking units 69 and 70 for performing heat treatment after the exposure processing, post baking units 71 and 72, and so on are, for example, eight-tiered in the order from the bottom.

In a center part of the interface section 4, a wafer carrier 80 is provided as shown in FIG. 1. The wafer carrier 80 is structured so as to be movable in the X-direction (the vertical direction in FIG. 1) and the Z-direction (the perpendicular direction), and to be rotatable in the θ-direction (the direction of rotation about the Z-axis), so that it is accessible to the extension and cooling unit 66 and the extension unit 67 which are included in the fourth processing unit group G4, an edge exposure unit 81, and the not-shown aligner to carry the wafer W to each of them.

Figure 6:
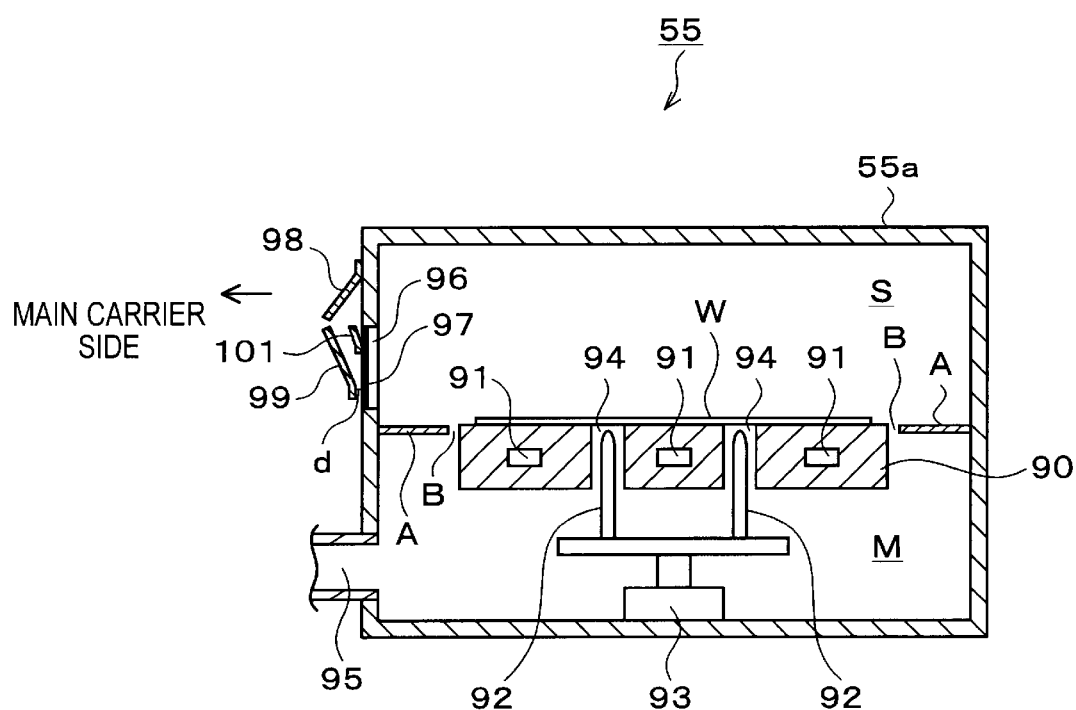
FIG. 6 is an explanatory view of a vertical cross section of the cooling unit according to the embodiment.

Next, the structure of the above-described cooling unit 55 is explained. As shown in FIG. 6, at the center part in a casing 55a of the cooling unit 55, a cooling plate 90 which is formed in a thick disc shape is provided to cool the wafer W by mounting it thereon. The cooling plate 90 includes therein, for example, Peltier elements 91, which serve as thermal sources for cooling the cooling plate 90 to a predetermined temperature, so that the cooling plate 90 can be maintained at a predetermined cooling temperature by controlling voltage applied to the Peltier elements 91.

Below the cooling plate 90, raising and lowering pins 92 are provided for supporting and raising and lowering the wafer W when carrying the wafer W in/out, and configured to be movable upward and downward by means of a raising and lowering drive mechanism 93. In the vicinity of the center part of the cooling plate 90, provided are holes 94 penetrating the cooling plate 90 in the perpendicular direction, through which the raising and lowering pins 92 move in the vertical direction to project out from the cooling plate 90.

Outside the cooling plate 90 and between the cooling plate 90 and the casing 55a, a flat plate A is provided to partition the casing 55a into a processing chamber S at the upper part of the casing 55a where cooling treatment is performed for the wafer W and a mechanical chamber M at the lower part of the casing 55a where the raising and lowering pins 92 and the so on are provided. The flat plate A, however, is not a plate for completely blocking atmospheres in the processing chamber S and the mechanical chamber M, but a gap B is provided between the flat plate A and the cooling plate 90, through which gas can flow between the processing chamber S and the mechanical chamber M.

Below the cooling plate 90 and to a side surface of the casing 55a, an exhaust pipe 95 is attached which exhausts the atmosphere in the mechanical chamber M to exhaust the atmosphere in the mechanical chamber M to thereby purge impurities such as dust and the like produced from the raising and lowering pins 92 and so on during the cooling treatment.

In the side surface on the main carrier 13 side of the casing 55a, provided is a transfer port 96 through which the wafer W passes when carried in/out. At the transfer port 96, a shutter 97 is provided for opening and closing the transfer port 96 and is kept closed other than when the wafer W is carried, thereby keeping a predetermined atmosphere within the casing 55a.

Figure 7:
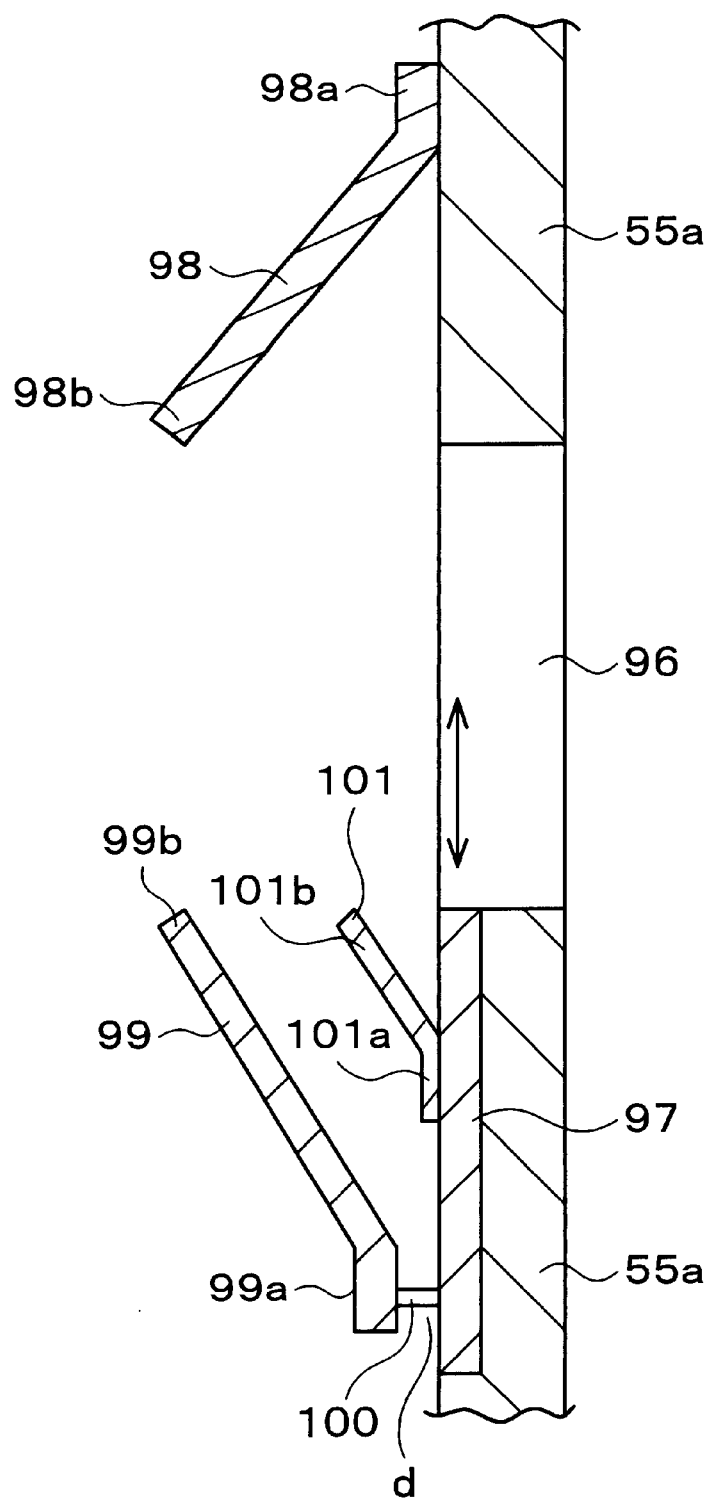
FIG. 7 is an enlarged view showing a structure in the vicinity of a transfer port of the cooling unit in FIG. 6.

Outside the casing 55a and above the transfer port 96, as shown in FIG. 7, a guide plate 98 constituting an inflow restricting device is provided, which controls and guides air flowing from the top toward the bottom in the processing station 3. The guide plate 98 has a top part 98a bonded to the casing 55a and has a shape increasingly distant from the casing 55a with descent from the top part 98a toward a bottom part 98b.

Outside the shutter 97, a current regulating plate 99 is provided which controls and regulates the current of air flowing from the bottom toward the top in the processing station 3. The current regulating plate 99 is attached to the shutter 97 by an attachment member 100 at its bottom part 99a so as to create a gap d and is obliquely provided in a manner to be increasingly distant from the shutter 97 with ascent from the bottom part 99a toward a top part 99b. This enables air entering between the current regulating plate 99 and the shutter 97 to be exhausted downward from the gap d. The top part 99b of the current regulating plate 99, disposed to be at the same level as that of the top part of the shutter 97, does not interfere with the wafer W being carried in/out while the shutter 97 is opened.

Between the current regulating plate 99 and the shutter 97, a guide member 101 is provided which guides air entering between the above-described current regulating plate 99 and the shutter 97 to the gap d. The guide member 101 is of the same shape as that of the current regulating plate 99, that is, a plate shape, which is attached to the shutter 97 at its bottom part 101a and has a shape increasingly distant from the shutter 97 with ascent therefrom toward a top part 101b.

Next, the operation of the cooling unit 55 as structured above is explained together with the steps of a photolithography process performed in the coating and developing treatment system 1.

First, the wafer carrier 8 takes out one unprocessed wafer W from the cassette C and carries it to the adhesion unit 56 which is included in the third processing unit group G3. The wafer W, which is coated with an adhesion promoter such as HMDS for improving adhesion to the resist solution in the adhesion unit 56, is carried to the cooling unit 55 by the main carrier 13 where it is cooled to a predetermined temperature, for example, 23° C.

Thereafter, the wafer W which has been cooled to 23° C. is carried to the resist coating unit 51 or 53 by the main carrier 13, where a resist film is formed on the wafer W. The wafer W is thereafter carried to the pre-baking unit 58 or 59 and the extension and cooling unit 66 in sequence again by the main carrier 13 to undergo predetermined processing.

Then, the wafer W is taken out of the extension and cooling unit 66 by the wafer carrier 80 and carried via the edge exposure unit 81 to the aligner (not shown) where exposure of a pattern is performed. The wafer W after undergoing the exposure processing is carried to the extension unit 67 by the wafer carrier 80 and further carried to the post-exposure baking unit 69 or 70, the developing unit 52 or 54, the post-baking unit 60, 61, 71, or 72, and the cooling unit 65 in sequence by the main carrier 13 to undergo predetermined processing in each of the units. Thereafter, the wafer W is returned to the cassette C via the extension unit 57 by the wafer carrier 8, and a series of predetermined coating and developing treatment is finished.

It should be noted that during the coating and developing treatment, the air supply unit 5 always supplies clean gas at predetermined temperature and humid into the coating and developing treatment system 1 to form a descending current therein. For example, air supplied into the coating and developing treatment system 1 is regulated in temperature to be 23° C. the same as that in a clean room. However, the temperature of the air is sometimes raised to be a temperature higher than 23° C., for example, about 24° C. if the air current reaches in the vicinity of the cooling unit 55 at the bottom, by the influence of, for example, the post-baking units 60 and 61 and the pre-baking units 58 and 59 and the like.

In such a case, the cooling treatment in the cooling unit 55 may not performed appropriately under the influence of increase in temperature of the air. However, by the cooling unit 55 according to the invention, the cooling treatment can be preferably performed in spite of such conditions. This treatment is explained in detail.

Figure 8:
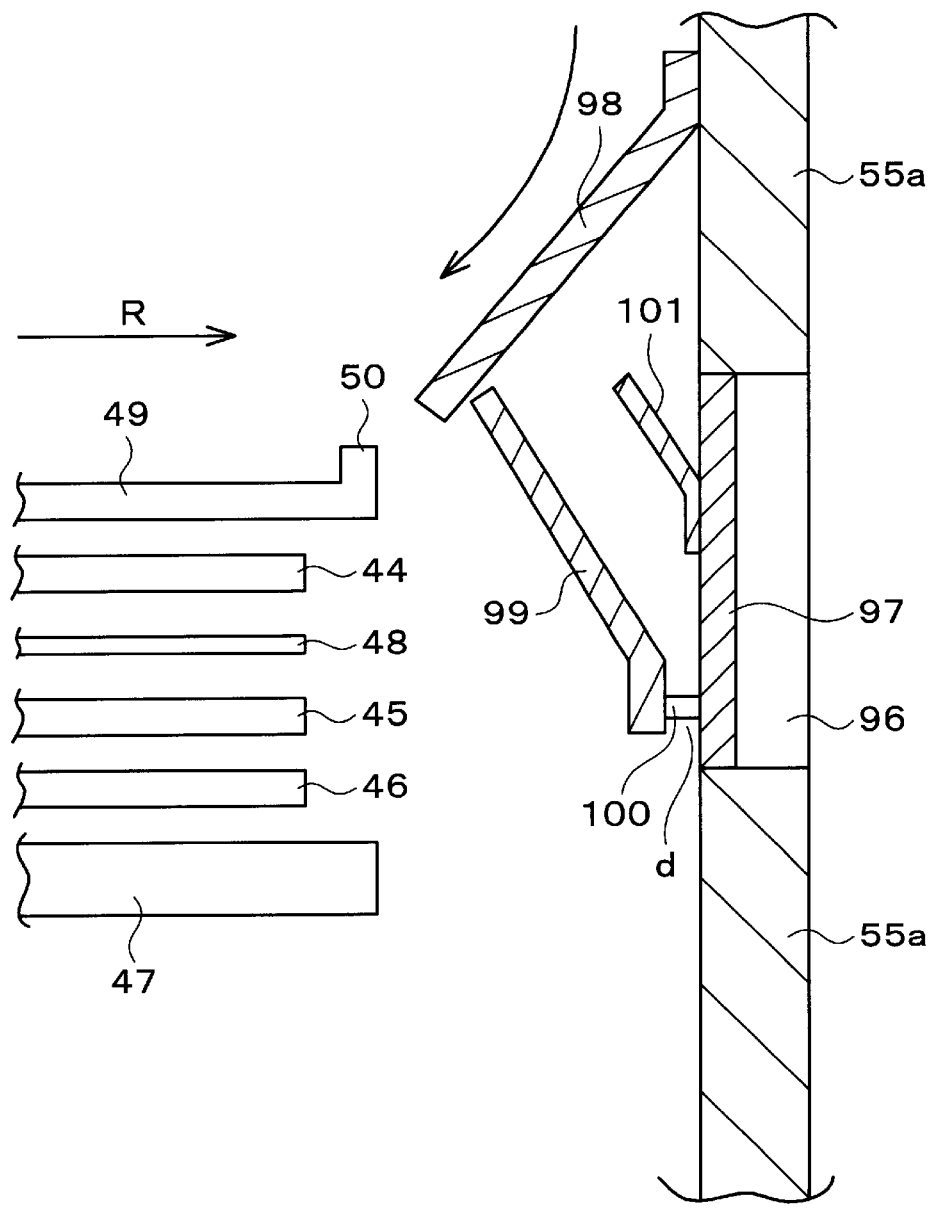
FIG. 8 is an explanatory view showing a state where a shutter is closed.

First, before the start of the cooling treatment for the wafer W. the shutter 97 of the casing 55*a* is closed as shown in FIG. 8 to restrict the air in the processing station 3 from flowing into the cooling unit 55 by the guide plate 98 and the current regulating plate 99.

After the completion of the adhesion treatment that is a preceding step, the wafer W is held by the carrier arm 44 of the main carrier 13. Then, the transfer base 47 descends to move the carrier arm 44 to the same level as that of the cooling unit 55. Subsequently, the shutter 97 is opened and the carrier arm 44 moves forward in the R-direction to move the wafer W to a position above the cooling plate 90 in the casing 55*a*.

Figure 9:
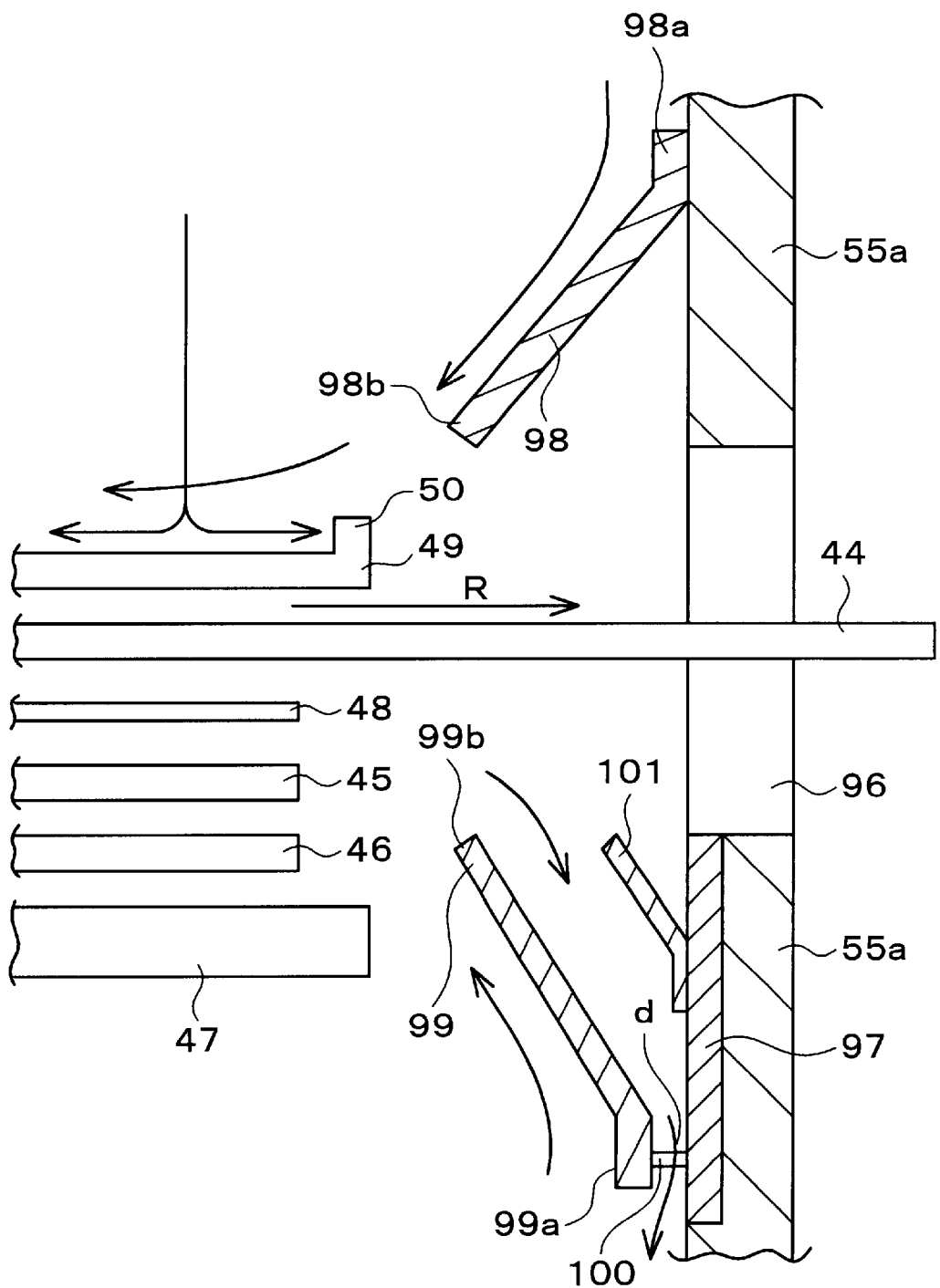
FIG. 9 is an explanatory view showing a state in which the shutter is opened and a carrier arm enters a casing.

In this event, a part of the air flowing downward in the processing station 3 hits against the guide plate 98, is then guided onto the horizontal plate 49, and is caused to flow in the opposite direction to the transfer port 96 of the cooling unit 55, the negative direction of the R-direction as shown in FIG. 9. Air directly hits against the horizontal plate 49 from above is diffused by the horizontal plate 49 and then flows in every direction, but air toward the transfer port 96 is blocked by the vertical plate 50. Further, when a part of the air enters between the current regulating plate 99 and the shutter 97, the air is guided by the guide member 101 and exhausted from the gap d to below the transfer port 96. As described above, the air in the processing station 3 is guided in a direction away from the transfer port 96 to be restricted from flowing into the casing 55*a*.

On the other hand, the wafer W moved to the position above the cooling plate 90 in the casing 55*a* is delivered from the carrier arm 44 to the raising and lowering pins 92 which have been raised are kept waiting in advance. At this moment, exhaustion from the exhaust pipe 95 is started to start the purge of the inside of the mechanical chamber M. Then, the wafer W is lowered with descent of the raising and lowering pins 92 to be mounted on the cooling plate 90 which is kept at, for example, 23° C. The carrier arm 44 retreats in the negative direction of the R-direction to be returned again into the case 40. After the carrier arm 44 retreats from the casing 55*a*, the shutter 97 is closed.

When the wafer W is mounted on the cooling plate 90, cooling is started for the wafer W to cool it for a predetermined period. After a lapse of the predetermined period, the wafer W having been cooled at 23° C., the raising and lowering pins 92 are raised to finish the cooling of the wafer W.

After the completion of the cooling of the wafer W, the shutter 97 is opened again, and the carrier arm 44 enters the casing 55*a* through the transfer port 96 to receive the wafer W from the raising and lowering pins 92 and carry it out of the cooling unit 55. In this event, the air flowing down in the processing station 3 is guided and its current is regulated, by the guide plate 98, the horizontal plate 49 and the vertical plate 50 to be restricted from flowing into the casing 55*a* through the transfer port 96, in the same manner as that during the carrying-in of the wafer W.

Particularly when the wafer W is carried out, a negative pressure is formed in the whole casing 55*a* by the exhaust from the exhaust pipe 95, which forms near the transfer port 96 a local ascending current toward the transfer port 96, but the ascending current is regulated in the direction away from the transfer port 96 by the current regulating plate 99.

Thereafter, when the wafer W is carried out of the casing 55*a*, the shutter 97 is closed again, and a series of cooling treatment is finished.

According to the above-described embodiment, the guide plate 98 is provided above the transfer port 96 to guide the descending current formed in the processing station 3 in the direction away from the transfer port 96, so that the descending current of air is restricted from flowing into the cooling unit 55. Therefore, air having a different temperature from that of the wafer W is prevented from contacting the wafer W in the cooling unit 55 and restricting unevenness of temperature distribution of the wafer W.

Further, the horizontal plate 49 is provided above the carrier arm 44, so that the air guided by the guide plate 98 can be guided as it is in the direction away from the transfer port 96. Furthermore, the vertical plate 50 is provided on the horizontal plate 49, so that air directly hitting against the horizontal plate 49 from above can be restricted from flowing in the direction of the transfer port 96.

Moreover, the current regulating plate 99 is provided below the transfer port 96, so that even when the local ascending current is formed near the transfer port 96, the ascending current can be regulated in the direction away from the transfer port 96 to restrict the air from flowing into the transfer port 96.

The gap d is provided between the bottom part 99*a* of the current regulating plate 99 and the shutter 97, which enables the air entering between the current regulating plate 99 and the shutter 97 to be exhausted through the gap d. This prevents the air entering between the current regulating plate 99 and the shutter 97 from being bounced at the bottom of the current regulating plate 99 and flowing into the transfer port 96.

The guide member 101 is provided between the current regulating plate 99 and the shutter 97, which makes it possible to exhaust the air preferably through the above-described gap d.

Since the current regulating plate 99 is provided on the shutter 97, the guide plate 98 and the current regulating plate 99 get closer to each other when the shutter 97 is closed to restrict the air in the processing station 3 from flowing into the inside of the guide plate 98 and the current regulating plate 99, thereby also restricting the air from flowing into the casing 55*a* through a gap around the shutter 97 or the like.

Figure 10:
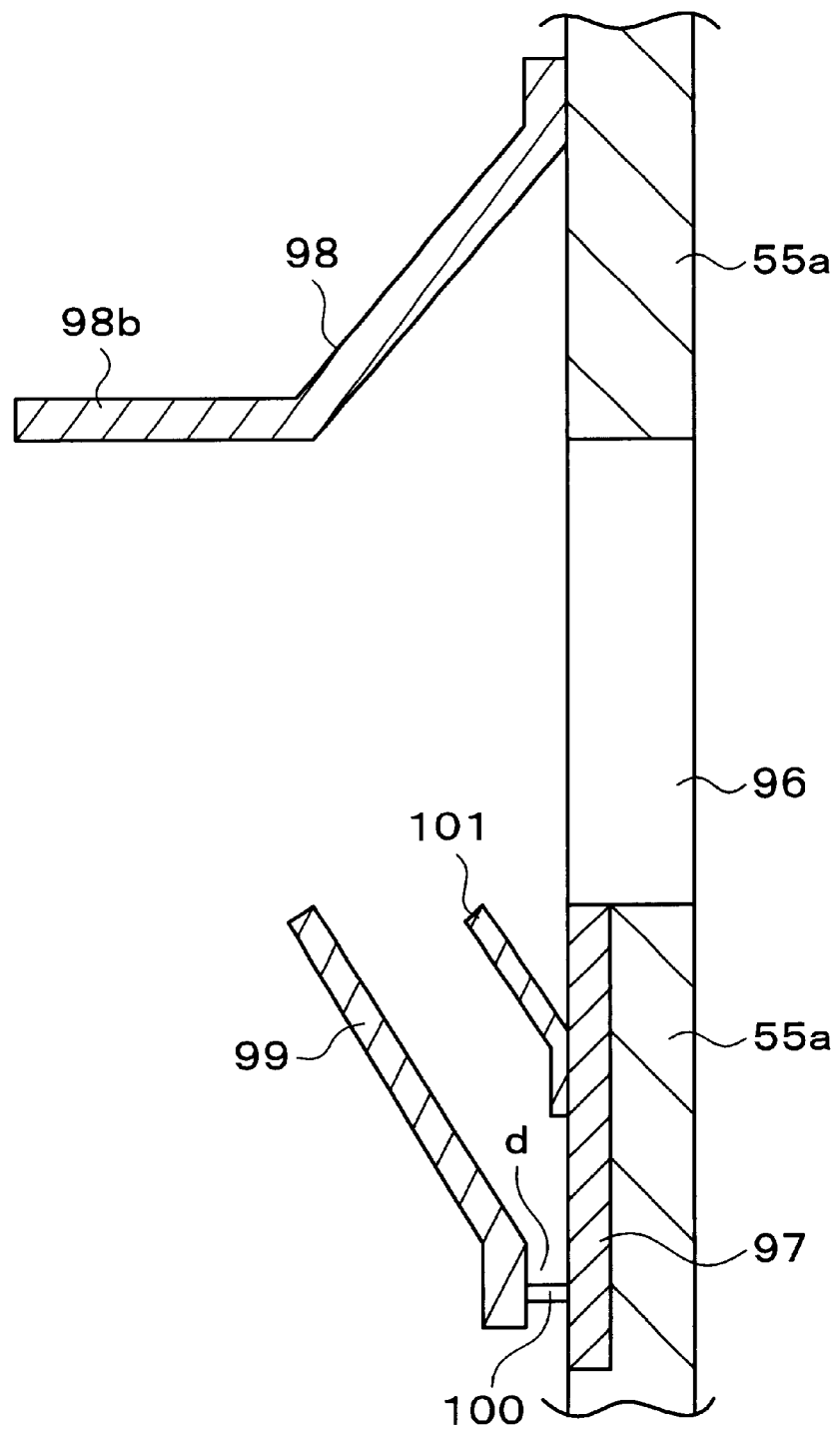
FIG. 10 is an explanatory view showing another structure example of a guide member.

The above-described bottom part 98*b* of the guide plate 98 may be horizontally formed in a direction away from the casing 55*a* as shown in FIG. 10. Such a horizontal form of the bottom part 98*b* of the guide plate 98 guides the air flowing down in the processing station 3 to a position farther from the transfer port 96, thereby preventing more certainly the air from flowing into the transfer port 96.

Though the current regulating plate 99 is attached to the shutter 97 in the above-described embodiment, the current regulating plate 99 may be attached to the casing 55*a* at a position below the transfer port 96. In this case, it is also possible to regulate the locally formed ascending current to restrict the ascending current from flowing into the transfer port 96. It should be noted that the guide member 101 may also be attached to the casing 55*a*.

Although the horizontal plate 49 above the carrier arm 44 is provided fixed on the transfer base 47 in the above-described embodiment, the horizontal plate 49 may be provided to be movable in the R-direction similarly to the carrier arm 44. In such a case, it is possible that the horizontal plate 49 is moved depending on the strength and direction of the air current to regulate the air in the processing station 3 at a position where the horizontal plate 49 can regulate the air most efficiently.

Although the above-described vertical plate 50 provided on the horizontal plate 49 is formed in a curved shape, which is convex toward the transfer port 96 side as viewed from a plan view, it may be linearly formed as viewed from a plan view. Further, the vertical plate 50 is not necessarily vertical but may be of a shape tilted toward the transfer port 96.

It is also appropriate to provide only the horizontal plate 49 without providing the vertical plate 50. In such a case, since the air from the guide plate 98 obliquely hits against the horizontal plate 49 and is also guided in the opposite direction to the transfer port 96, the amount of air flowing into the transfer port 96 can be suppressed as compared to that of the conventional case.

Figure 11:
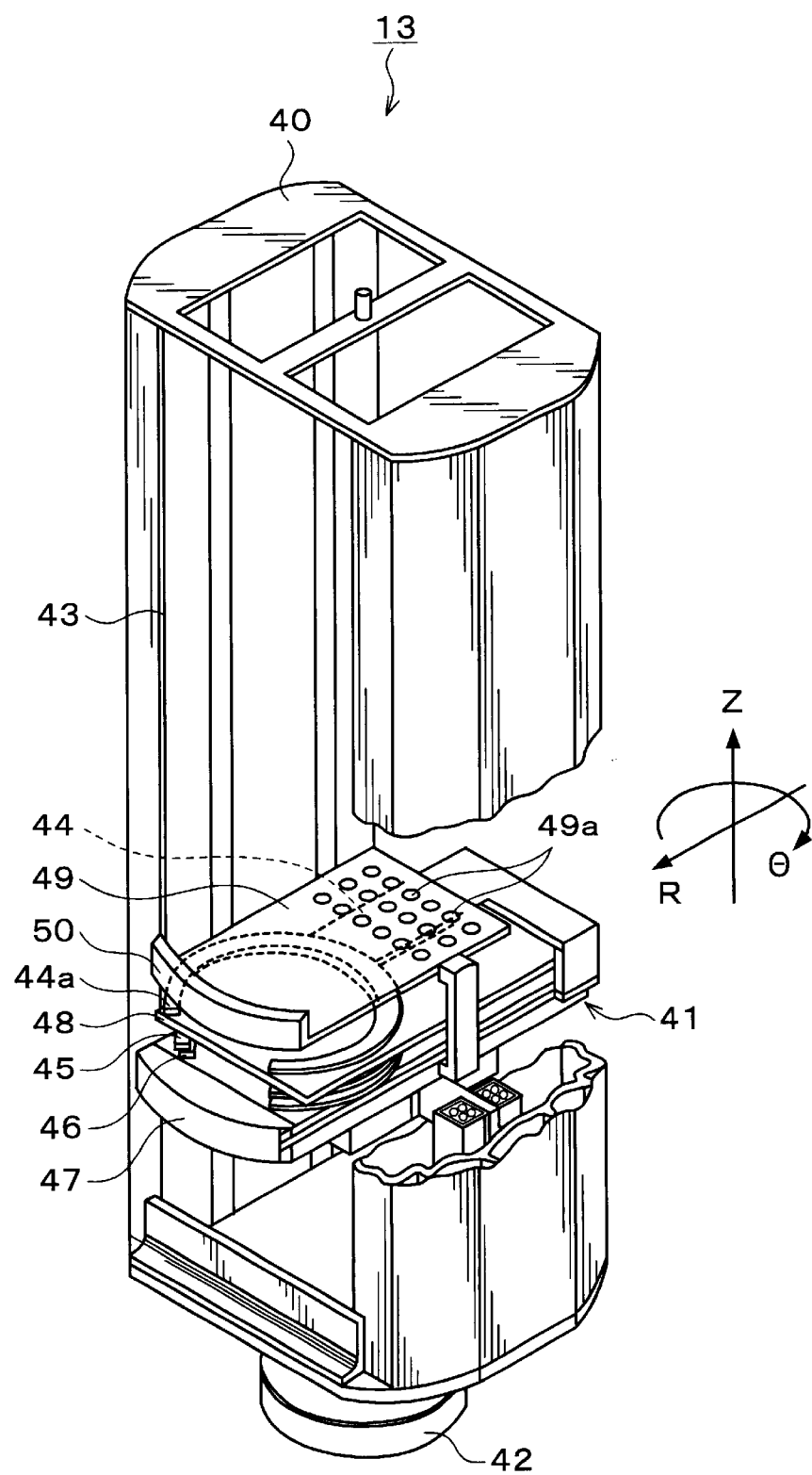
FIG. 11 is a schematic perspective view of a main carrier provided with a horizontal plate having air holes.

Furthermore, the horizontal plate 49 may be provided with air holes 49*a*, as shown in FIG. 11, on the rear side of the wafer transfer mechanism 41, that is, on the opposite side to the vertical plate 50 on the horizontal plate 49. With such an arrangement, a part of the downflow toward the horizontal plate 49 passes through the air holes 49*a* downward to the carrier arm 44 side to thereby restrict particles from staying on the carrier arm 44.

Furthermore, as for the cooling unit 55, it is preferable to provide in the casing 55*a* a gas introducer 55*b* for supplying a clean gas, for example, clean air. The clean air is introduced into the casing 55*a* to form a positive pressure in the casing 55*a*, that is, to make the pressure in the casing 55*a* higher than that outside the casing 55*a* at the time when the shutter 97 is opened to carry the wafer W into the casing, thereby preventing particles from entering the casing 55*a* through the transfer port 96.

Figure 12:
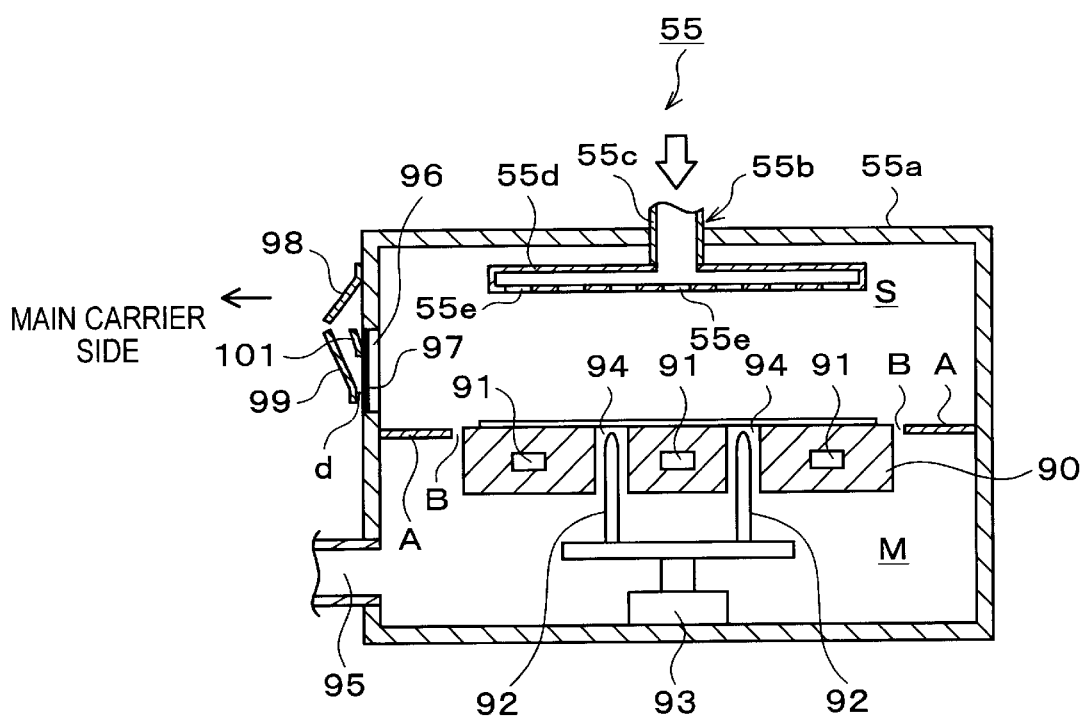
FIG. 12 is an explanatory view of a vertical cross section of a cooling unit having a gas introducer in its casing.

The gas introducer 55*b* can be constituted of, for example, an introducing pipe 55*c* and a baffle board 55*d* as shown in FIG. 12. In a lower surface of the baffle board 55*d*, a number of blow-out ports 55*e* are formed. Use of such a baffle board 55*d* enables clean air to flow uniformly to the wafer W, never affecting in-plane uniformity in temperature of the wafer W.

The above-described embodiment is realized as the cooling unit 55 before the resist coating, and the present invention is applicable to another substrate processing unit, for example, the PEB unit 69 or 70, the pre-baking unit 58 or 59, the post-baking unit 60, 61, 71, or 72, the cooling unit 65 or 68, the adhesion unit 56, the resist coating unit 51 or 53, the developing unit 52 or 54, or the like. Further, the present invention may be applied to a plurality of processing units in the coating and developing treatment system 1.

Although the above-described embodiment is a processing unit for the wafer in the a photolithography process in semiconductor device fabrication processes, the present invention is also applicable to a processing unit for substrates other than the semiconductor wafer, for example, an LCD substrate.

According to the present invention, the atmosphere can be restricted from flowing into the casing. This restricts the temperature of the substrate in the processing unit from being partially changed by the atmosphere and temperature distribution from becoming ununiform within a plane of the substrate. Consequently, the substrate is processed at a uniform temperature, resulting in improved yields.

What is claimed is:

1. A processing unit for processing a substrate in a casing, comprising:
   a transfer port provided in said casing, through which the substrate passes when the substrate is carried into said casing by a carrier for carrying the substrate; and
   an inflow restricting device for controlling an atmosphere outside said casing to restrict the atmosphere from flowing into said casing through said transfer port;
   wherein said inflow restricting device has a current regulating plate for regulating in a direction away from said transfer port a gas current of the atmosphere flowing from bottom to top, and
   wherein said current regulating plate has a bottom part located at a position below said transfer port and has a shape increasingly distant from said casing with ascent from the bottom part toward a top part of said current regulating plate, and
   wherein said current plate is provided on a shutter for opening/closing said transfer port.

2. A processing unit for processing a substrate as set forth in claim 1,
   wherein said inflow restricting device has a guide plate for guiding in a direction away from said transfer port a gas current of the atmosphere flowing from top to bottom, and
   wherein said guide plate has a top part attached to said casing at a position above said transfer port and has a shape increasingly distant from said casing with descent from the top part toward a bottom part of said guide plate.

3. A processing unit for processing a substrate as set forth in claim 2,
   wherein the bottom part of said guide plate is horizontally formed.

4. A processing unit for processing a substrate as set forth in claim 1 wherein there is a gap between the bottom part of said current regulating plate and said casing.

5. A processing unit for processing a substrate as set forth in claim 4,
   wherein a guide member is provided between said current regulating plate and said casing, which guides to said gap a part of the atmosphere flowing in through said transfer port.

6. A processing unit for processing a substrate in a casing, comprising:
   a transfer port provided in said casing, through which the substrate passes when the substrate is carried into said casing by a carrier for carrying the substrate; and
   an inflow restricting device for controlling an atmosphere outside said casing to restrict the atmosphere from flowing into said casing through said transfer port;
   wherein said inflow restricting device has a current regulating plate for regulating in a direction away from said transfer port a gas current of the atmosphere flowing from bottom to top,
   wherein said current regulating plate has a bottom part located at a position below said transfer port and has a shape increasingly distant from said casing with ascent from the bottom part toward a top part of said current regulating plate, wherein there is a gap between the bottom part of said current regulating plate and said casing, and wherein a guide member is provided between said current regulating plate and said casing, which guides to said gap a part of the atmosphere flowing in through said transfer port.

7. A processing unit for processing a substrate as set forth in claim 6, further comprising:

a gas introducer for introducing a clean gas into said casing to make a pressure in said casing higher than a pressure outside said casing at least when the substrate is carried into said casing.

8. A processing unit for processing a substrate as set forth in claim 7, wherein said gas introducer has a number of blow-out ports for blowing out gas uniformly into said casing.

9. A processing unit for processing a substrate in a casing, comprising:

a transfer port provided in said casing, through which the substrate passes when the substrate is carried into said casing by a carrier for carrying the substrate; and an inflow restricting device for controlling an atmosphere outside said casing to restrict the atmosphere from flowing into said casing through said transfer port;

wherein said carrier has a guide for guiding in a direction, other than the direction of said transfer port, the atmosphere guided by a guide plate, wherein said carrier has a carrier arm for holding the substrate, wherein said guide is a horizontal plate provided above said carrier arm, and wherein an air hole penetrating said horizontal plate is formed in a rear part of said horizontal plate.

10. A processing unit for processing a substrate in a casing, comprising:

a transfer port provided in said casing, through which the substrate passes when the substrate is carried into said casing by a carrier for carrying the substrate; and an inflow restricting device for controlling an atmosphere outside said casing to restrict the atmosphere from flowing into said casing through said transfer port;

wherein said carrier has a guide for guiding in a direction, other than the direction of said transfer port, the atmosphere guided by a guide plate, wherein said carrier has a carrier arm for holding the substrate, wherein said guide is a horizontal plate provided above said carrier arm, and wherein a vertical plate is provided on said horizontal plate.

11. A processing unit for processing a substrate as set forth in claim 10, wherein said vertical plate has a curved shape which is convex toward said transfer port side as viewed from a plan view.

12. A processing unit for processing a substrate as set forth in claim 10, wherein said vertical plate is movable toward said transfer port.

* * * * *